(12) United States Patent
Nakayoshi et al.

(10) Patent No.: US 6,337,258 B1
(45) Date of Patent: Jan. 8, 2002

(54) METHOD OF DIVIDING A WAFER (75) Inventors: Hideo Nakayoshi, Yokohama; Shinya Takyu, Kitakatsushika-gun; Keisuke Tokubuchi, Yokkaichi; Tetsuya Kurosawa, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/620,709

(22) Filed: Jul. 20, 2000

(30) Foreign Application Priority Data

Jul. 22, 1999 (JP) .............................. 11-207793

(51) Int. Cl.⁷ .............................................. H01L 21/46
(52) U.S. Cl. ..................... 438/464; 436/461; 436/462; 436/465
(58) Field of Search ................. 438/460, 461, 438/462, 464, 465, 928, 977

(56) References Cited

U.S. PATENT DOCUMENTS

| | | |
|---|---|---|
| 4,023,260 A | 5/1977 | Schneider |
| 4,722,130 A | 2/1988 | Kimura et al. |
| 4,904,610 A | 2/1990 | Shyr |
| 4,978,639 A | 12/1990 | Hua et al. |
| 5,071,792 A | 12/1991 | VanVonno et al. |
| 5,072,280 A | 12/1991 | Matsukura |
| 5,091,331 A | 2/1992 | Delgado et al. |
| 5,130,276 A | 7/1992 | Adams et al. |
| 5,185,292 A | 2/1993 | VanVonno et al. |
| 5,480,842 A | 1/1996 | Clifton et al. |
| 5,597,766 A | 1/1997 | Neppl |
| 5,714,405 A | 2/1998 | Tsubosaki et al. |
| 5,888,883 A | 3/1999 | Sasaki et al. |
| 5,994,205 A * | 11/1999 | Kaisha ................. 438/464 |

FOREIGN PATENT DOCUMENTS

| | | |
|---|---|---|
| DE | 30 43 903 | 1/1982 |
| EP | 0 617 456 | 9/1994 |
| EP | 0 631 315 | 12/1994 |
| JP | 54-14155 | 2/1979 |
| JP | 55-52235 | 4/1980 |
| JP | 59-186345 | 10/1984 |
| JP | 61-112345 | 5/1986 |
| JP | 62-4341 | 1/1987 |
| JP | 63-117445 | 5/1988 |
| JP | 63-261851 | 10/1988 |
| JP | 64-38209 | 2/1989 |
| JP | 3-191549 | 8/1991 |
| JP | 4-223356 | 8/1992 |
| JP | 4-297056 | 10/1992 |
| JP | 4-307756 | 10/1992 |
| JP | 4-367250 | 12/1992 |
| JP | 5-74934 | 3/1993 |
| JP | 5-211235 | 8/1993 |
| JP | 5-291397 | 11/1993 |
| JP | 6-132432 | 5/1994 |
| JP | 7-106285 | 4/1995 |
| JP | 9-213662 | 8/1997 |
| JP | 2-737859 | 4/1998 |

* cited by examiner

Primary Examiner—David Nelms
Assistant Examiner—Dung A Le
(74) Attorney, Agent, or Firm—Finnegan, Henderson, Farabow, Garrett, & Dunner, L.L.P.

(57) ABSTRACT

Grooves are formed in an element formation surface of a wafer along dicing lines or chip dividing lines. The grooves are deeper than a thickness of a finished chip. A holding member is attached on the element formation surface of the wafer. A bottom surface of the wafer is lapped and polished to the thickness of the finished chip, thereby dividing the wafer into chips. The chips are transferred while being held by porous adsorption.

16 Claims, 7 Drawing Sheets

METHOD OF DIVIDING A WAFER

CROSS-REFERENCE TO RELATED APPLICATIONS

This application is based upon and claims the benefit of priority from the prior Japanese Patent Application No. 11-207793, filed Jul. 22, 1999, the entire contents of which are incorporated herein by reference.

BACKGROUND OF THE INVENTION

The present invention relates to a method of dividing a wafer and a method of manufacturing a semiconductor device, and more particularly, to manufacturing steps of dicing semiconductor elements formed on a wafer into chips and sealing the chips in packages. These methods are suitably used in reducing semiconductor packages in size and thickness and adopted when a lager wafer is used.

The manufacturing steps for a semiconductor device are roughly classified into two: one is a step for forming patterns of various semiconductor elements on a wafer (semiconductor substrate) and the other is a step for dicing the semiconductor elements formed on the wafer into chips and sealing them in packages. Recently,, to reduce manufacturing cost of semiconductor devices, the diameters of wafers have been increased. At the same time, to enhance the packaging density, the packages are desired to be miniaturized (decreased in size and thickness).

Conventionally, in order to seal a semiconductor chip in the miniaturized package, a wafer is reduced in thickness prior to dicing the wafer into chips. More specifically, a bottom surface of a wafer (opposite to a pattern formation surface (major surface) of the wafer) is lapped by a grindstone and polished by free grind grains, and thereafter the wafer is diced. When the wafer is lapped, the pattern formation surface of the wafer is protected by attaching an adhesive sheet thereon or coated with a resist. Thereafter, grooves are formed along dicing lines formed on the major surface of the wafer. These grooves are formed by means of a diamond scriber, a diamond blade, a laser scriber, or the like. In the dicing step, a half-cut method in which the wafer itself is diced to ½ of the thickness of the wafer or diced until the wafer is about 30 $\mu$m thick; a half-cut method in which an adhesive sheet is attached to the bottom surface of the wafer, and thereafter, the wafer is diced in the same manner as above; or a full-cut method in which the wafer with the adhesive sheet attached thereto is completely diced until the adhesive sheet is cut into to a depth of 20 to 30 $\mu$m. The half-cut method requires a chip-separation step. When the wafer is used alone, the wafer is separated into chips by sandwiching it between soft films and applying an external force to the wafer by means of a roller or the like. When the adhesive sheet is attached to the wafer, the wafer is separated into chips by applying an external force to the wafer via the sheet. The chips thus separated are removed from the sheet in the following manner. The bottom surface of the sheet is pushed up by a pickup needle provided in a die bonding device. The needle penetrates the sheet and comes in direct contact with the bottom surface of each chip and further lifts up the chip to remove it from the sheet. The surface of the chip thus removed is adsorbed by means of a tool called a "collet" and mounted on an island of a lead frame. After each of the pads of the chip is electrically connected to an inner lead portion of the lead frame by means of wire bonding, the resultant chip is sealed in a package. The chip is mounted on the island by previously applying a conductive paste on the island, by using gold-silicon eutectic, or by a method in which a thin metal film is deposited on the bottom surface of the wafer and then the wafer is mounted by use of solder.

Figure 1:
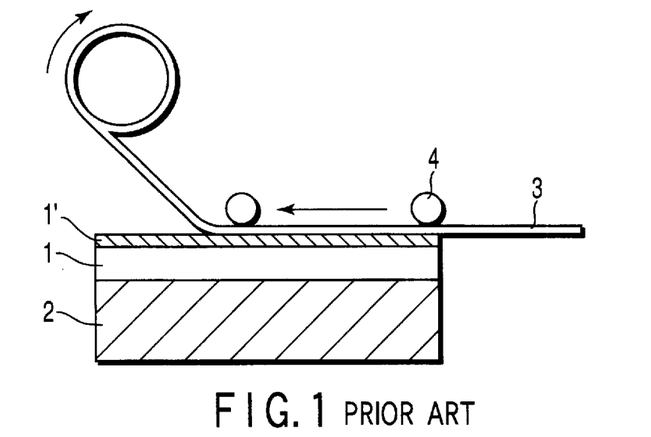
FIG. 1 is a cross-sectional view showing a step of attaching a surface protection tape on a wafer, for use in illustrating a conventional method of dividing a wafer and manufacturing a semiconductor device.
Figure 2:
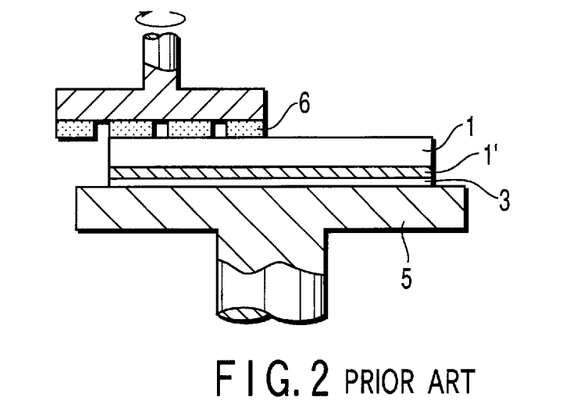
FIG. 2 is a cross-sectional view showing a step of lapping and polishing a bottom surface of the wafer, for use in illustrating the conventional method of dividing a wafer and manufacturing a semiconductor device.
Figure 3:
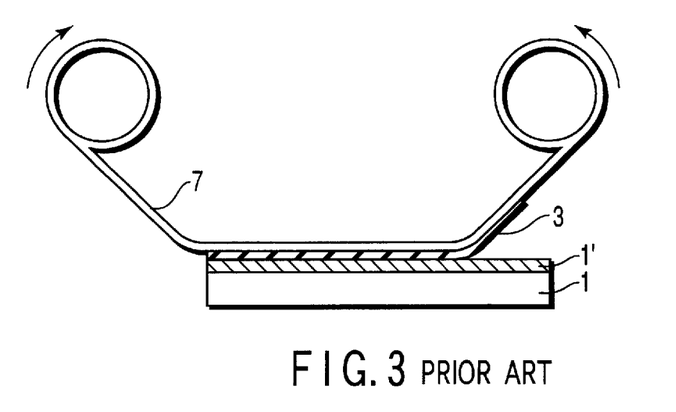
FIG. 3 is a cross-sectional view showing a step of removing the surface protection tape, for use in illustrating the conventional method of dividing a wafer and manufacturing a semiconductor device.
Figure 4A:
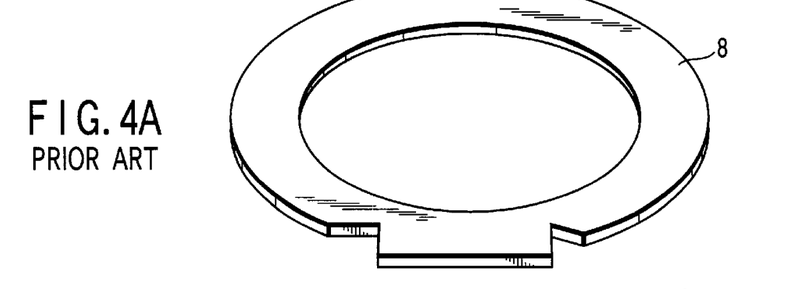
FIG. 4A is a perspective view of a flat ring for fixing a wafer on a fixing sheet, for use in illustrating the conventional method of dividing a wafer and manufacturing a semiconductor device.
Figure 4B:
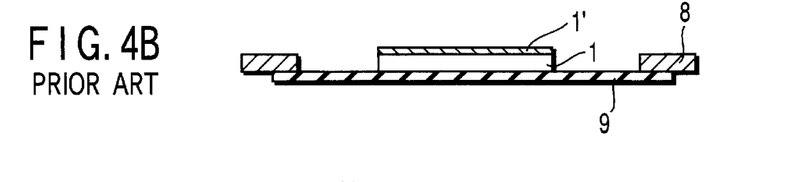
FIG. 4B is a cross-sectional view showing a step of fixing a wafer on a fixing sheet, for use in illustrating the conventional method of dividing a wafer and manufacturing a semiconductor device.
Figure 5:
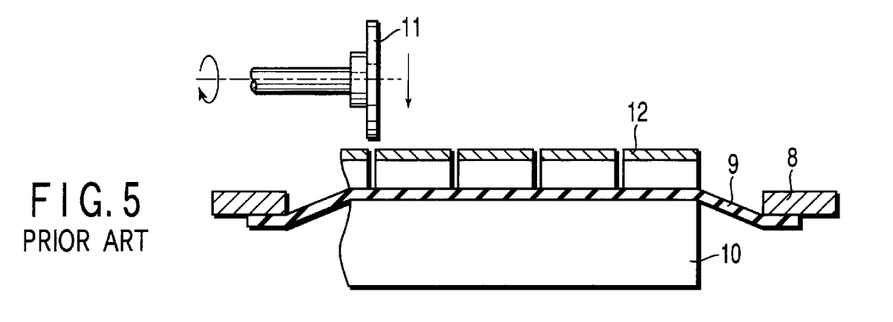
FIG. 5 is a cross-sectional view showing a step of dicing a wafer, for use in illustrating the conventional method of dividing a wafer and manufacturing a semiconductor device.
Figure 6:
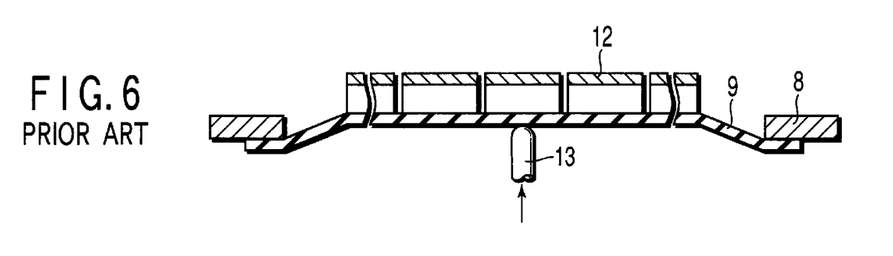
FIG. 6 is a cross-sectional view showing a step of picking up chips, for use in illustrating the conventional method of dividing a wafer and manufacturing a semiconductor device.
Figure 7:
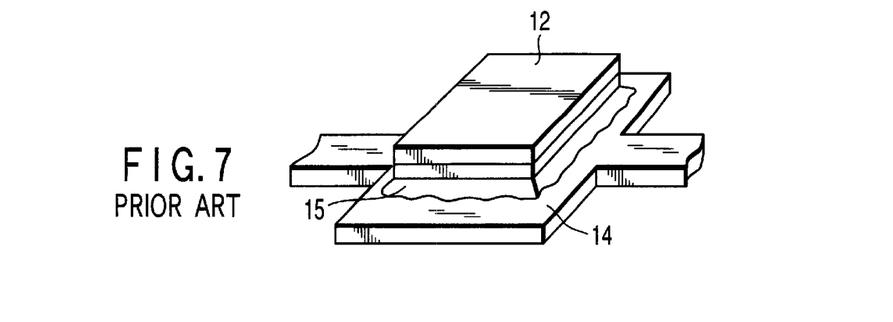
FIG. 7 is a perspective view showing a die-bonding step, for use in illustrating the conventional method of dividing a wafer and manufacturing a semiconductor device.

FIGS. 1 to 7 are used for explaining an example of the conventional wafer dividing method and semiconductor device manufacturing method mentioned above. More specifically, FIG. 1 illustrates a step of attaching a surface protection tape on a wafer; FIG. 2 is a step of lapping and polishing the bottom surface of the wafer; FIG. 3 is a step of removing the surface protection tape; FIGS. 4A and 4B are steps of fixing the wafer on a fixing sheet; FIG. 5 is a step of dicing the wafer; FIG. 6 is a step of picking up separated chips; and FIG. 7 is a die bonding step.

As is shown in FIG. 1, after an element formation step is completed, the bottom surface of a wafer 1 is fixed on a porous chuck table 2. A protection tape 3 is attached to a pattern formation surface 1' of the wafer 1 by moving an attachment roller 4 in the direction indicated by an arrow in the figure while rotating it. Subsequently, as shown in FIG. 2, the wafer 1 is fixed on a chuck table 5 with the pattern formation surface 1' thereof (having the protection tape 3 attached thereto) faced down. The bottom surface of the wafer 1 is lapped and polished to a predetermined depth (i.e. a predetermined thickness of a finished chip) by means of a grindstone 6. Thereafter, as shown in FIG. 3, a tape 7 (for use in removing the protection tape 3) is attached to the protection tape 3 and then the protection tape 3 is removed from the pattern formation surface 1'. Subsequently, a flat ring 8 is fixed on a wafer fixing sheet 9, as shown in FIG. 4A, to prevent the sheet 9 from becoming slack or wrinkled. In this state, the wafer 1 is fixed on the sheet 9 within the opening of the flat ring 8, as shown in FIG. 4B. The sheet 9 having the wafer 1 fixed thereon and the flat ring 8 are fixed on a dicing chuck table 10. The wafer 1 is diced (full-cut) by a dicing blade 11 into chips 12 (see FIG. 5). Thereafter, as is shown in FIG. 6, a pickup needle 13 is allowed to pass through the sheet 9 from the bottom thereof and brought in contact with the bottom surface of each chip 12. The chip 12 is pushed upward by the needle 13 to thereby remove it from the sheet 9. The separated chip 12 is mounted on an island 14 of a lead frame, as shown in FIG. 7, by using a die bonding adhesive 15 such as a conductive paste. Thereafter, inner lead portions (not shown) of the lead frame are wire-bonded to pads of the chip 12, and the resultant structure is sealed into a package formed of a resin or ceramic. In this way, the semiconductor device are completely fabricated.

However, the above-described wafer dividing method and semiconductor device manufacturing method have the following problems (a) to (c).

(a) The wafer is easily broken while it is reduced in thickness by lapping. Even if the wafer is lapped with the protection tape being attached thereto, the wafer may warp by distortion due to the lapping. As a result, the wafer may be caught and broken during transfer within the lapping apparatus. The wafer is reduced in strength as the wafer becomes thin or large in diameter. Therefore, in the transfer method presently employed of transferring the wafer after it is reduced in thickness in order to apply various treatments, there is a high possibility of breaking the wafer. For example, the durable stress of the wafer is up to about 1.6 Kgf/mm$^2$ in the case of a wafer having a thickness of 400 $\mu$m, whereas, when the thickness of the wafer is reduced to 200 $\mu$m, the durable stress decreases to ¼ as low as 0.4 Kgf/mm$^2$.

(b) Since two sheets are used for protecting the pattern formation surface and for holding the wafer at the time of dicing, cost for materials increases. Extra steps are required for attaching and removing each of the two sheets, so that the number of manufacturing steps also increases.

(c) When the wafer is diced, the bottom surface of the wafer is chipped more than the upper surface side, with the result that the breaking-resistance of the chip decreases. In addition, recently transistors, resistors and capacitors for monitoring various characteristics (hereinafter referred to as "TEG" (Test Element Group)) have been arranged on dicing lines to integrate devices with a high density, although they are arranged within the chip in conventional devices. Since the TEG devices are formed of oxide films, aluminum, etc., when the TEG devices are diced by using a diamond blade, the clogging of the blade easily occurs. As a result, the cutting edge of the blade is made dull. Therefore, when the TEG is arranged on the dicing lines, the chipping of the bottom side of the wafer further increases. Since the semiconductor substrate is generally formed of a fragile material such as silicon or GaAs, if there is a crack, the breaking resistance of the wafer is easily decreased.

To solve the aforementioned problems, the semiconductor device manufacturing method disclosed in Japanese Patent Publication No. 2737859 suggests that the upper surface (pattern formation side) of the wafer is cut to a predetermined depth, the wafer (the surface pattern formation side) and a fitting tool are adhered on a base film, and the bottom surface of the wafer is polished to divide into chips.

However, in the method (No. 2737859), when the chips are removed from the base film, each of the chips is removed by pushing up through the bottom surface by a lift-up tool. At this time, the base film is distorted. Since the base film is adhered to the element formation surface (pattern formation surface) of the wafer, the element formation surface is inevitably lifted up by the lift-up tool. Therefore, the semiconductor elements may be damaged.

To prevent the semiconductor device from being damaged by the lift-up tool, for example, Japanese Patent Application KOKAI Publication No. 5-74934 suggests a method in which a die-bonding tape is attached to the bottom surface of the wafer after the wafer is divided into chips by lapping the bottom surface, and thereafter an adhesive sheet (base film) is removed.

However, this method (No. 5-74934) produces another problem. Since the chips are held by the die-bonding tape alone, the chips cannot be held flat. As a result, the chips interfere with each other and get chipped when they are transferred. In this way, there is a problem of quality degradation is produced.

In brief, the conventional wafer dividing method and semiconductor device manufacturing method have the following problems mentioned above. First, the wafer is easily broken when the wafer is reduced in thickness or transferred. Second, pieces chipped off from the bottom side of the wafer are larger than the surface side when the wafer is diced. As a result, the breaking resistance of the chip decreases.

To overcome these problems, a method has been suggested in which a notch is made in the element formation surface of the wafer followed by lapping the bottom surface to divide the wafer into chips. However, this method has a problem. The semiconductor elements are damaged when the chips are picked up. In addition, when transferred, the chips mutually interfere with each other and chipping occurs. Therefore, a problem of quality degradation is accompanied.

BRIEF SUMMARY OF THE INVENTION

A first object of the present invention is to provide a method of dividing a wafer while preventing the wafer from being broken and chipped when the wafer is reduced in thickness by lapping or is transferred.

A second object of the invention is to provide a method of dividing a wafer capable of improving the quality and manufacturing yield of chips.

A third object of the invention is to provide a method of manufacturing a semiconductor device while preventing a wafer from being broken and chipped when the wafer is reduced in thickness by lapping or is transferred, thereby preventing quality degradation of the wafer.

A fourth object of the invention is to provide a method of manufacturing a semiconductor device capable of improving the quality and manufacturing yield of the semiconductor device.

The first and second objects can be achieved by a wafer dividing method comprising:

a first step of forming grooves in an element formation surface of a wafer, along dicing lines or chip dividing lines, the grooves being deeper than a thickness of a finished chip;

a second step of attaching a holding member on the element formation surface of the wafer;

a third step of lapping and polishing a bottom surface of the wafer to the thickness of the finished chip, thereby dividing the wafer into chips; and a fourth step of transferring the chips while holding the chips by porous adsorption.

According to the wafer dividing method mentioned above, a wafer is divided into chips by forming grooves deeper than a thickness of a finished chip in an element formation surface of a wafer, and lapping and polishing a bottom surface of the wafer to the thickness of the finished chip. It is therefore possible to prevent breakage and chipping of the wafer. In addition, the chips divided in the above are transferred while holding them by porous adsorption. It is therefore possible to prevent mutual interference between the chips, preventing occurrence of the chipping. As a result, quality degradation of the chips is successfully prevented, so that the chips can be manufactured in a high quality and in a high yield.

The first object of the present invention can also be achieved by a wafer dividing method comprising:

a first step of forming grooves in an element formation surface of a wafer along dicing lines or chip dividing lines, the grooves being deeper than a thickness of a finished chip;

a second step of attaching a first holding member on the element formation surface of the wafer;

a third step of lapping and polishing a bottom surface of the wafer to the thickness of the finished chip, thereby dividing the wafer into chips;

a fourth step of transferring the chips while holding the chips by porous adsorption;

a fifth step of attaching bottom surfaces of the chips to a second holding member having a flat ring; and a sixth step of removing the first holding member.

According to the wafer dividing method mentioned above, a wafer is divided into chips by forming grooves deeper than a thickness of a finished chip in an element formation surface of a wafer and lapping and polishing a bottom surface of the wafer to the thickness of the finished chip. It is therefore possible to prevent the wafer from being broken and chipped. Furthermore, the chips are transferred while holding them by porous adsorption. It is therefore possible to prevent mutual interference between the chips, preventing occurrence of chipping. Moreover, the first holding member is removed by attaching the bottom surfaces of the chips to the second holding members having a flat ring. It is therefore possible to prevent the semiconductor elements from being damaged when they are picked up. In addition, since the chips can be held flat by the flat ring, it is possible to prevent mutual interference between the chips, preventing occurrence of chipping. Therefore, quality degradation of the formed chips is prevented to form high--quality chips with a high yield.

The third and fourth objects of the present invention can also be achieved by a semiconductor device manufacturing method comprising:

a first step of forming semiconductor elements on a major surface of a wafer;

a second step of forming grooves in the major surface of the wafer along dicing lines or chip dividing lines, the grooves being deeper than a thickness of a finished chip;

a third step of attaching a holding member on the major surface of the wafer;

a fourth step of lapping and polishing a bottom surface of the wafer to the thickness of the finished chip, thereby dividing the wafer into chips;

a fifth step of transferring the chips while holding the chips by porous adsorption; and a sixth step of mounting the chips transferred on lead frames and sealed in packages.

According to the semiconductor device manufacturing method mentioned above, a wafer is divided into chips by forming grooves deeper than a thickness of a finished chip in an element formation surface of a wafer, and lapping and polishing a bottom surface of the wafer to the thickness of the finished chip. It is therefore possible to prevent breakage and chipping of the wafer. Furthermore, the chips are transferred to a die-bonding step while being held by porous adsorption. It is therefore possible to prevent mutual interference between the chips, preventing occurrence of the chipping. As a result, the quality and yield of the chips can be improved.

Furthermore, the third and fourth objects of the present invention can be achieved by a semiconductor device manufacturing method comprising:

a first step of forming semiconductor elements on a major surface of a wafer;

a second step of forming grooves in the major surface of a wafer along dicing lines or chip dividing lines, the grooves being deeper than a thickness of a finished chip;

a third step of attaching a first holding member on the major surface of the wafer;

a fourth step of lapping and polishing a bottom surface of the wafer to the thickness of the finished chip, thereby dividing the wafer into chips;

a fifth step of transferring the chips while holding the chips by porous adsorption; and a sixth step of attaching bottom surfaces of the chips to a second holding member having a flat ring;

a seventh step of removing the first holding member; and an eighth step of mounting the chips on lead frames and sealed in packages.

According to the semiconductor device manufacturing method mentioned above, a wafer is divided into chips by forming grooves deeper than a thickness of a finished chip in the surface of a wafer on which surface semiconductor elements are formed, and lapping and polishing a bottom surface of the wafer to the thickness of the finished chip. It is therefore possible to prevent breakage and chipping of the wafer. Furthermore, the chips are transferred while being held by porous adsorption. It is therefore possible to prevent mutual interference between the chips, preventing occurrence of the chipping. Furthermore, since the first holding member is removed by attaching the bottom surfaces of the chips to the second holding member having a flat ring, it is possible to prevent the semiconductor elements from being damaged when the chips are picked up in order to mount them on the lead frame. In addition, since the chips can be held flat by the flat ring, it is possible to prevent mutual interference between the chips, preventing occurrence of the chipping during transfer. As a result, the quality and yield of the chips can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 8:
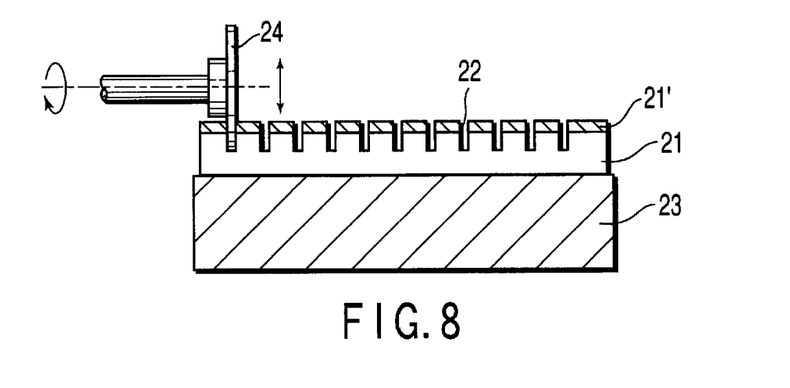
FIG. 8 is a cross-sectional view showing a step of forming grooves on a wafer along dicing lines, for use in illustrating a method of dividing a wafer and manufacturing a semiconductor device according to a first embodiment of the present invention.
Figure 9:
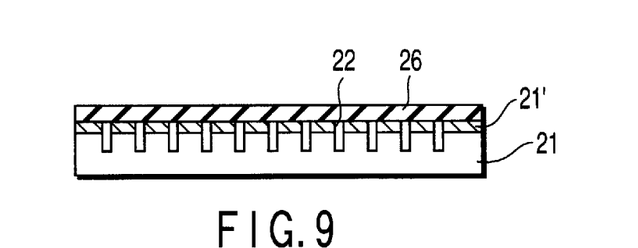
FIG. 9 is a cross-sectional view showing a step of attaching a surface protection tape on a wafer, for use in illustrating the method of dividing a wafer and manufacturing a semiconductor device according to the first embodiment of the present invention.
Figure 10:
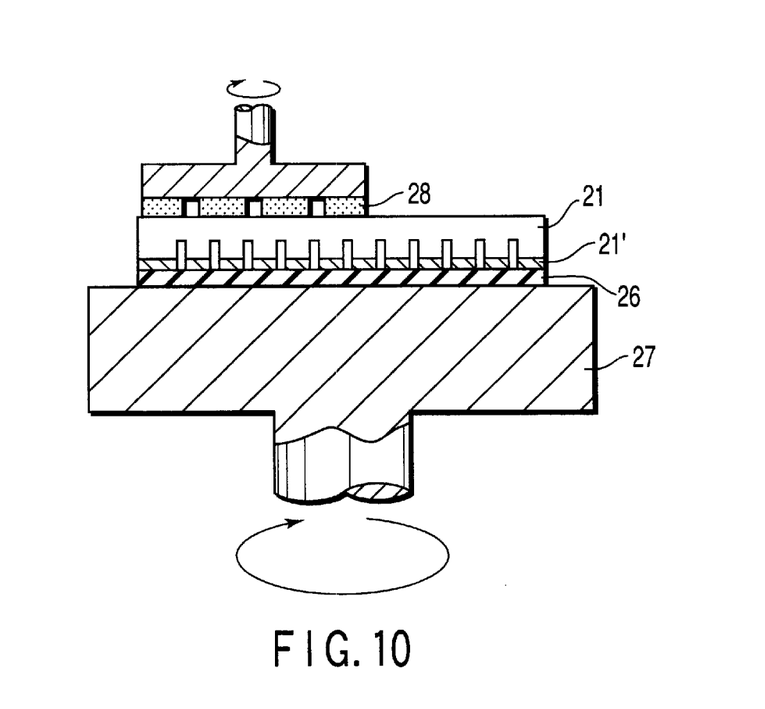
FIG. 10 is a cross-sectional view showing a step of lapping and polishing a bottom surface of a wafer, for use in illustrating the method of dividing a wafer and manufacturing a semiconductor device according to the first embodiment of the present invention.
Figure 11:
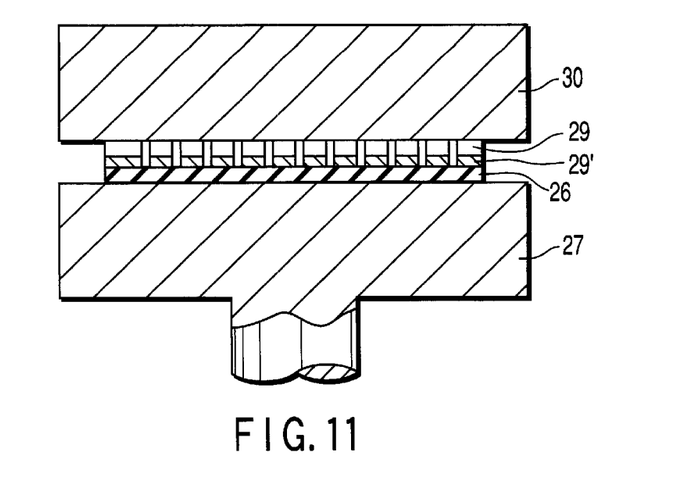
FIG. 11 is a cross-sectional view showing a step of holding the divided wafer by porous adsorption, for use in illustrating the method of dividing a wafer and manufacturing a semiconductor device according to the first embodiment of the present invention.
Figure 12:
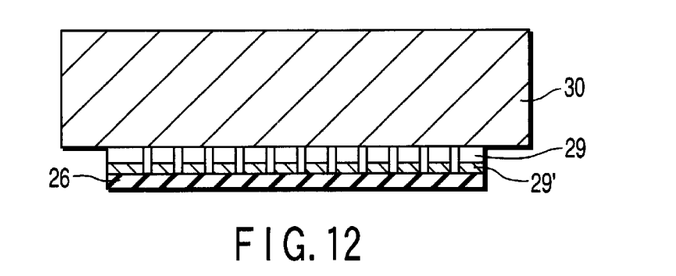
FIG. 12 is a cross-sectional view showing a step of transferring the chips while holding them by porous adsorption, for use in illustrating the method of dividing a wafer and manufacturing a semiconductor device according to the first embodiment of the present invention.
Figure 13:
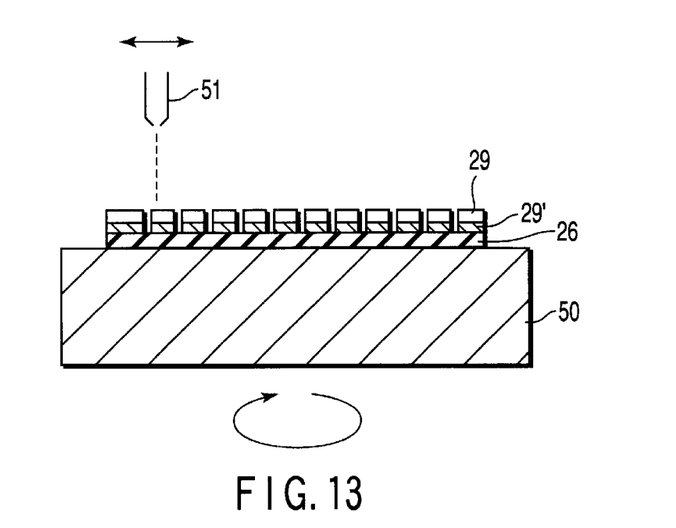
FIG. 13 is a cross-sectional view showing a step of cleaning the chips, for use in illustrating the method of dividing a wafer and manufacturing a semiconductor device according to the first embodiment of the present invention.
Figures 14A, 14B, 14C, 14D:
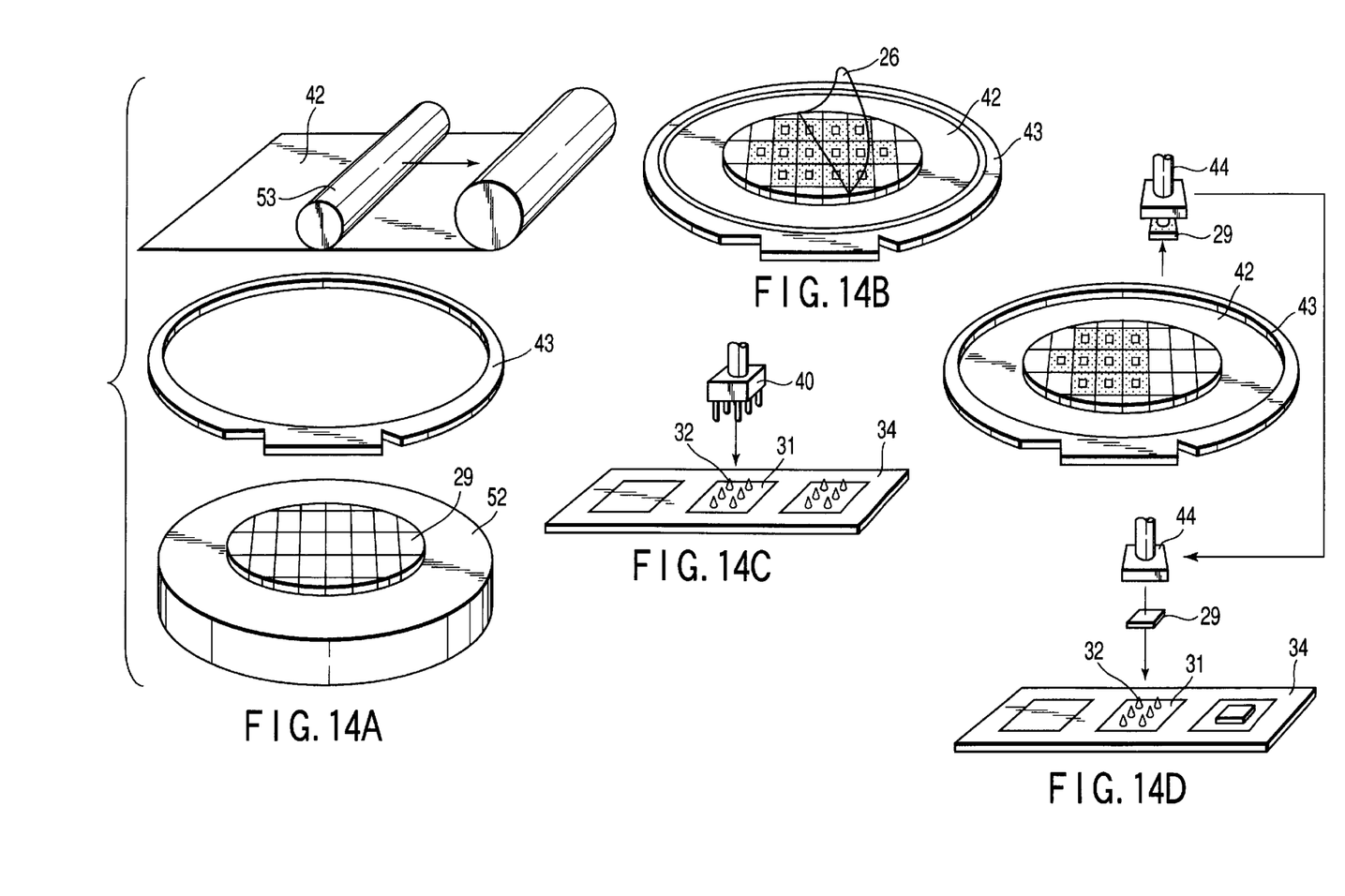
FIGS. 14A to 14D are perspective views showing a step of mounting the chips transferred on a lead frame, for use in illustrating the method of dividing a wafer and manufacturing a semiconductor device according to the first embodiment of the present invention.
Figure 15:
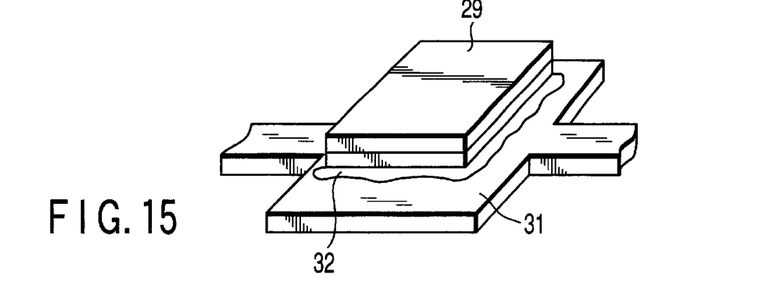
FIG. 15 is a perspective view showing a die-bonding step, for use in illustrating the method of dividing a wafer and manufacturing a semiconductor device according to the first embodiment of the present invention.
Figure 16:
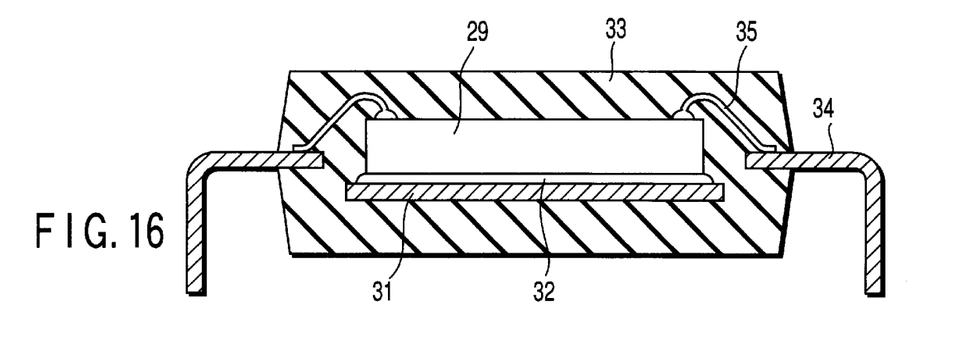
FIG. 16 is a cross-sectional view of a semiconductor device sealed in a package, for use in illustrating the method of dividing a wafer and manufacturing a semiconductor device according to the first embodiment of the present invention.

FIGS. 8 to 16 illustrate a wafer dividing method and a semiconductor device manufacturing method according to a first embodiment of the present invention. Specifically, FIG. 8 illustrates a step of forming grooves in a wafer along dicing lines; FIG. 9 illustrates a step of attaching a surface protection tape to the wafer; FIG. 10 illustrates a step of lapping and polishing the bottom surface of the wafer (a dividing step); FIG. 11 illustrates a step of picking up separated wafer; FIG. 12 illustrates a step of transferring the chips; and FIG. 13 illustrates a step of cleaning the chips; FIGS. 14A to 14D illustrate a step of mounting the transferred chips to a lead frame; FIG. 15 illustrates a die bonding step; and FIG. 16 illustrates a step of sealing the chip into a package.

First, various semiconductor elements are formed on a wafer 21 according to known manufacturing steps. Thereafter, the wafer 21 is fixed on a chuck table 23 of a dicing apparatus by means of a vacuum suction or the like, with a pattern formation surface (major surface 21') faced up, as shown in FIG. 8. Subsequently, grooves 22 are formed along dicing lines at a predetermined depth by a dicing blade 24 while the blade is rotated at a predetermined rotational speed with application of water. The depth of grooves 22 is rendered deeper than the thickness of a finished chip by at least 5 $\mu$m. Thereafter, the wafer 21 is cleaned and dried.

The grooves 22 is not always formed mechanically by using the dicing blade 24 as mentioned above. They may be formed chemically by an etching technique or the like. In the chemical method, the grooves 22 are, for example, formed by coating the major surface 21' of the wafer 21 with photoresist, and exposing chip parting lines (corresponding to dicing lines) by a PEP process or the like, and immersing the wafer 21 in a KOH solution, thereby selectively etching the wafer vertically (i.e., in the direction perpendicular to the major surface of the wafer 21). In place of the wet etching using the KOH solution, dry etching technique such as RIE (reactive ion etching) may be employed. In the RIE, only silicon is selectively etched by an $SF_6$ gas and a gas mixture of $SF_6$/CF serving as an etching gas, at a vacuum (the degree of vacuum) of 60 mtorr. In particular, if the gas mixture of $SF_6$/CF is used, etching is performed anisotropically, so that grooves can be formed substantially perpendicularly to the major surface 21' of the wafer 21. The method for forming grooves by etching is more advantageous than the mechanical method using the dicing blade 24 such as a diamond blade. This is because the side walls of the grooves 22 (cleaved surfaces) are unaffected by mechanical stress, so that it is possible to reduce crystal defects appearing in the cleaved surface. Other than the mechanical and chemical methods described above, an optical method using a laser scriber may be employed to form the grooves 22. What is important in the step of FIG. 8 is that the grooves 22 are made deeper than the thickness of a finished chip by at least 5 $\mu$m (such that the wafer is not completely separated into chips) no matter what method is employed to form the grooves 22.

As shown in FIG. 9, a surface protection tape 26 (one of sides of which an adhesive is applied) is fixed to the pattern formation surface 21' of the wafer 21 having the grooves (formed in the preceding step).

Thereafter, as shown in FIG. 10, the wafer 21 protected by the surface protection tape 26 is fixed on a chuck table 27 of a lapping apparatus by means of porous suction, vacuum suction or the like. The bottom surface of the wafer 21 is lapped by rotating the chuck table 27 and a grindstone 28 while the grindstone 28 is moved down. The lapping method of this type is generally called "in-feed lapping". Alternatively, another method called "through-feed lapping method" or "creep-feed lapping method" may be employed in which the wafer is lapped while the wafer 21 and grindstone 28 are being rotated. If the bottom surface of the wafer 21 is lapped when the lapped surface reaches the grooves 22, the wafer 21 is divided into chips 29. The lapping/polishing is continued even after the wafer 21 is divided into the chips 29, to at least 5 µm in depth. Even if the region where a cleaved face by dicing is crossed with a polished face formed by lapping/polishing is partly chipped, the chipped portion can be removed if the lapping/polishing operation is further continued. If the amount of the wafer removed by the lapping/polishing is increased, a much larger chipped portion can be removed. The amount removed by lapping/polishing may be set depending upon the requirements such as the thickness of the wafer 21, the thickness of a finished chip 29, and etc. Therefore, the thickness of the finished chip 29 can be reduced to, for example, 30 to 50 µm.

When the bottom surface of the wafer 21 is lapped to the groove 22 to divide the wafer 21 into chips, the lapping can be performed by use of a grindstone containing particles uniform in diameter. However, in order to reduce the grinding time and prevent chipping, the lapping/polishing is preferably performed in two steps or more by using a grindstone containing at least two different particles in diameter. To be more specific, if lapping/polishing is performed by first a large-particle grindstone of about #360 (the diameters of major particles are 40 to 60 µm), and then a small-particle grindstone of about #2000 (the diameters of the major particles are 4 to 6 µm) to divide the chips, it is possible to reduce the time for dividing the wafer 21 into chips 29. In addition, since the small-particle grindstone is used when the wafer 21 is finally divided into chips, it is possible to reduce the generation of chipping.

When the wafer 21 protected by the surface protection tape 26 is fixed to the chuck table 27 of the lapping apparatus by means of porous adsorption, it is preferable that the adsorption surface of the chuck table 27 should be flat. However, if the adsorption surface is convexed, mutual interference between the chips can be reduced. Since the interval between the chips immediately after the chips are divided by lapping is as close as 30–50 µm, mutual interference of the chips may occur during transfer. However, the adsorption surface of the chuck table 27 is formed in a convex form, the interval between the chips at the side of a lapped surface (bottom surface) is broadened when separated. It is therefore possible to prevent the chips from interfering with each other.

The chips formed by dicing the wafer 21 are then transferred to a cleaning device. At this time, while the chips 29 are fixed on the chuck table 27 by the porous adsorption or vacuum adsorption, the bottom surface of the chips 29 is adsorbed by an adsorption material 30 made of porous ceramic as shown in FIG. 11, and thereafter, the adsorption by the chuck table 27 is terminated. Subsequently, as shown in FIG. 12, the chips 29 are moved and transferred onto a cleaning table 50 while the bottom surfaces of the chips 29 are porous-adsorbed by the adsorption material 30. The adsorption material 30 is preferably a flat board having pores of 0.5 mm or less in diameter and a density of at least 1/mm². This is because a number of chips 29 can be held flat and mutual interference between chips during transfer can be prevented. In this case, it is preferable that the chip-adsorption surface of the adsorption material 30 for use in the transfer operation should be substantially flat. However, if the surface for adsorbing the chip is concaved, the interval between the chips at the side to be adsorbed can be broadened. Therefore, the mutual interference between the chips 29 can be further decreased.

In this embodiment, the case is explained where the chips are transferred while the bottom surface of each of the chips is porous-adsorbed. However, depending upon the cleaning apparatus, it may be better that the chips are transferred by adsorbing the major surface 29' of each of the chips 29, more specifically, the surface protection tape 26. In this case, the adsorption material preferably has substantially a flat or convexity adsorption surface. If the surface of the adsorption material adsorbing a surface of a chip is convexed, the distance between the chips at a major surface side 29' is broadened since the surface of the chip to be adsorbed is fixed by the surface protection tape 26. It is therefore possible to reduce interference between the chips during transfer.

Subsequently, as shown in FIG. 13, water or a cleaning liquid is supplied to the bottom surfaces of the chips 29 from a nozzle 51 while the table 50 is rotated, thereby removing silicon chippings generated in the lapping and polishing step. Each of the chips is cleaned by sliding the nozzle 51 horizontally. The table 50 may be formed of a porous adsorption material to fix the chips by means of porous adsorption. It is preferable that the porous adsorption material should have substantially a flat or a convex-form adsorption surface.

Thereafter, chips 29 are removed from the cleaning table 50 and the bottom surfaces of the chips are attached to a holding member. The holding member is formed by attaching the surface protection tape 42 to the flat ring 43. More specifically, each chip 29 is placed on substantially a flat- or convex-stage 52 with the bottom surface faced up or fixed by porous adsorption. After a ring 43 is placed on the stage 52, the tape 42 is transferred by use of a roller 53, as shown in FIG. 14A. A UV-curing adhesive is applied onto the surface of the tape 42 on which the chip 29 is to be adhered. After that, the tape 42 is cut along the circumference of the ring 43.

After the adhesive is cured by UV irradiation, the surface protection tape 26 (which is used in the dicing step, lapping and polishing step, transfer step and cleaning step) is removed as shown in FIG. 14B.

Subsequently, as shown in FIG. 14C, a die-bonding adhesive such as a conductive paste 32 is applied onto an island 31 of the lead frame 34 by means of a dispenser 40. Then, pressure is applied upwardly onto the bottom surface of the chip 29 via the surface protection tape 42 by a pick-up needle to remove the chip 29 from the surface protection tape 42. In this case, it is the bottom surface of the chip 29 that the pressure is applied by the pick-up needle. Therefore, the semiconductor element is not damaged.

As shown in FIG. 14D, the chip 29 is picked up by a collet 44 of the die-bonding apparatus, transferred and mounted on the island 31 of the lead frame 34 coated with the conductive paste 32. This state is enlarged in FIG. 15. In place of the conductive paste, gold-silicon eutectic may be used when the chip is mounted. Alternatively, the chip 29 is mounted by depositing a thin metal film on the bottom surface of the wafer and then using solder.

Thereafter, each pad of the chip 29 is electrically connected to an inner lead portion of the lead frame with a bonding wire 35. The chip 29, island 31 and the inner lead portion of the lead frame 34 are sealed in a resin package or a ceramic package 33. Then, lead forming is performed to accomplish the semiconductor device as shown in FIG. 16.

According to the wafer dividing method and the semiconductor device manufacturing method mentioned above, grooves 22 are formed deeper than the thickness of a finished chip 29 in the element formation surface 21' of the wafer 21 and the bottom surface of the wafer 21 is lapped and polished to the depth corresponding to the thickness of the finished chip 29 to thereby divide the wafer 21 into the chips. It is therefore possible to prevent breakage of wafer 21 and chipping. The chips 29 are transferred while holding by means of porous adsorption. Therefore, mutual interference between the chips 29 is suppressed, preventing chipping. Furthermore, the surface protection tape 26 is removed by attaching the bottom surfaces of the chips 29 to the surface protection tape 42 having a flat ring 43. It is therefore possible to prevent the semiconductor element from being damaged when the chip is picked up in order to mount the lead frame 34. In addition, the chips 29 are held flat by means of the flat ring 43. It is therefore possible to prevent chipping due to mutual interference between the chips 29 during transfer. Consequently, quality degradation of the chips and the semiconductor device can be prevented and thereby the quality and yield are improved.

Figure 17:
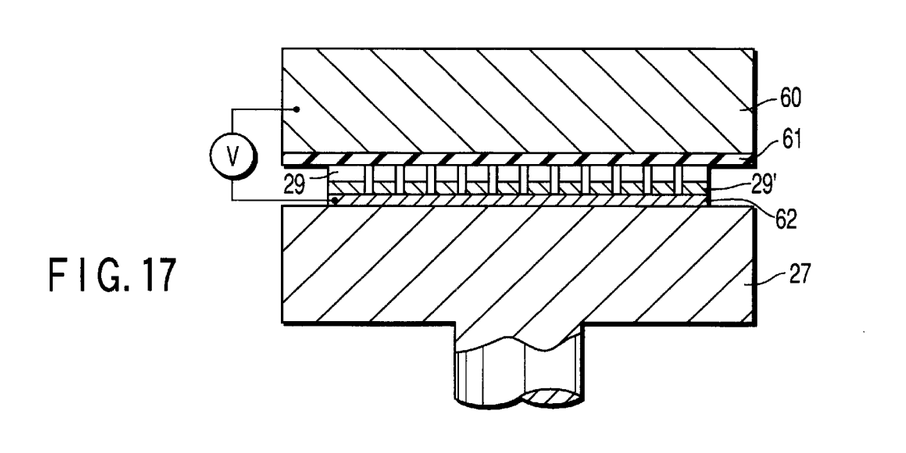
FIG. 17 is a cross-sectional view showing a step of holding the divided wafer by electrostatic adsorption, for use in illustrating a modified example of the method of dividing a wafer and manufacturing a semiconductor device according to the first embodiment of the present invention.
Figure 18:
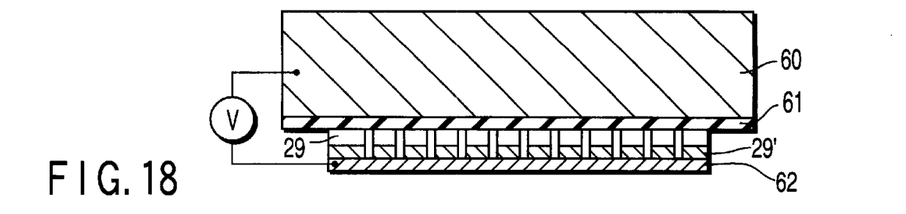
FIG. 18 is a cross-sectional view showing a step of transferring the chips by electrostatic adsorption, for use in illustrating another modified example of the method of dividing a wafer and manufacturing a semiconductor device according to the first embodiment of the present invention.

In the first embodiment, a number of chips 29 formed by dicing the wafer 21 are transferred to the cleaning table 50 while holding them by porous adsorption, as shown in FIGS. 11 and 12. However, chips 29 may be transferred to the cleaning table 50 while holding them by an electrostatic chuck, as shown in FIGS. 17 and 18. When the electrostatic chuck is used in place of the porous adsorption, a dielectric layer 61 is formed at a chip-adsorption surface of the sample table 60, at the same time a conductive tape 62 is used as the surface protection tape. Subsequently, a direct-current voltage V is applied between the sample table 60 and the conductive tape 62. In this way, the chips 29 are adsorbed by means of Coulomb force generated between the sample table 60 and each of chips 29.

In this case, the dielectric layer 61 preferably has substantially a flat surface. However, if the surface of the dielectric layer is concaved in the same as in the case of the porous adsorption, it is possible to broaden the distance between chips at the adsorption surface side. As a result, mutual interference between the chips 29 during transfer can be further reduced. On the other hand, if it is convenient that the chips are transferred by adsorbing the conductive tape 62, it is preferable that the dielectric layer 61 is formed so as to have substantially a flat surface or a convexity. If the chip adsorbing surface of the dielectric layer 61 is convexed, the intervals between chips at the major surface 29' side are broadened since the adsorption surface is fixed by the tape 62. Consequently, mutual interference between the chips 29 during transfer can be reduced.

In the mounting step shown in FIG. 14A, a UV curing adhesive is applied to the surface of the tape 42 to which the chips 29 are to be adhered. However, a thermosetting adhesive such as an epoxy-base adhesive may be used. The epoxy base adhesive is cured by application of heat, so that its adhesiveness is lowered. Alternatively, a rubber-base adhesive may be used. The rubber-base adhesive is cured by cooling, so that its adhesiveness is lowered.

Figure 19A:
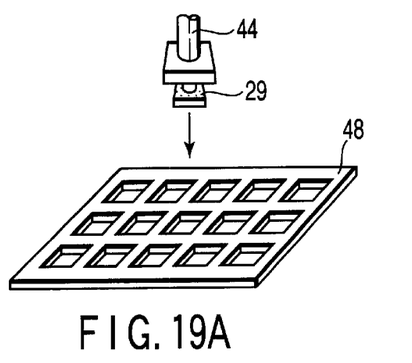
FIG. 19A is a perspective view showing a step of storing the chips in a tray, for use in illustrating a method of dividing a wafer and manufacturing a semiconductor device according to a second embodiment of the present invention.
Figure 19B:
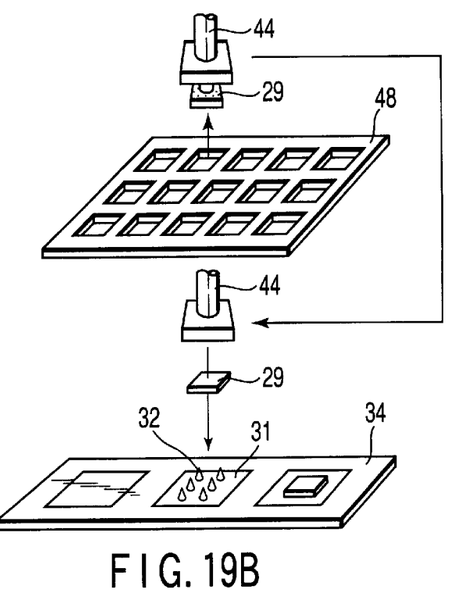
FIG. 19B is a perspective view showing a step of mounting the chips stored in the tray on a lead frame, for use in illustrating the method of dividing a wafer and manufacturing a semiconductor device according to the second embodiment of the present invention.

FIGS. 19A and 19B are used for explaining a method of manufacturing a semiconductor device according to a second embodiment of the present. These figures show a step of mounting the chip picked up by a collet on a lead frame. First, a wafer 21 is divided into chips 29 in the same manner as in the first embodiment in accordance with FIGS. 8 to 14A and 14B. Then, the chips are picked up. More specifically, each of the chips 29 is lifted up upward by pushing the bottom surface of the chip 29 by a pick-up needle, removed from the surface protection tape 42 and then picked up by a collet 44.

Subsequently, the chip 29 is stored in a chip tray 48 in such a way that a major surface (pattern forming surface) of the chip 29 faced up, as shown in FIG. 19A. Thereafter, the chip 29 is picked up from the chip tray 48 by adsorbing by the collet 44, as shown in FIG. 19B. The chip 29 held by the collet 44 is transferred on an island 31 of the lead frame 34 and die-bonded on the island 31.

In the aforementioned mounting method, it is possible to readily transfer the chips 29 to a manufacturing apparatus placed at a distance, another room and another factory while they are stored in the chip tray 48. They are flexibly applied to various manufacturing apparatus and manufacturing method.

Figure 20:
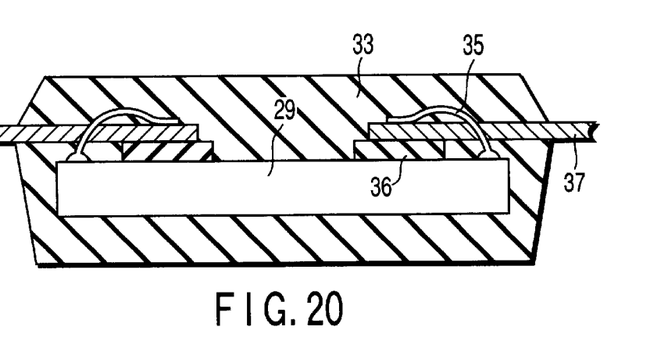
FIG. 20 is a cross-sectional view of a semiconductor device sealed in an LOC package, for use in illustrating a method of dividing a wafer and manufacturing a semiconductor device according to a third embodiment of the present invention.

FIG. 20 is used for explaining the method of manufacturing a semiconductor device according to a third embodiment of the present invention. FIG. 20 shows the divided chip sealed in an LOC (Lead On Chip) package. The chip is packaged in the LOC package in the following procedures after the pick-up step shown in FIG. 14D. First, an end of the lead 37 is bonded onto the chip 29 with an adhesive tape 36 interposed between them. Thereafter, each pad of the chip 29 is connected to a lead 37 with a bonding wire 35. The resultant construct is packaged in a resin package 33 or a ceramic package. In this way, a semiconductor device is formed as shown in FIG. 20.

At this time, if silicon chippings are present on the chip 29, there is a danger that the silicon chippings cause breakage of surface protection film on the chip 29 by being pressed at the time of adhesion of the lead 37 and wire-bonding, producing defects such as a breakage of aluminum wiring and short circuit. Then, if the adhesion tape 36 is formed thicker than the silicon chippings, it is possible to suppress occurrence of the defects mentioned above.

According to the above-described wafer dividing methods and semiconductor device manufacturing methods, the following advantages (1) to (7) are obtained.

(1) The percent defective of wafers can be reduced. The percent defective is a breakage ratio of the wafer when the wafer is reduced in thickness.

Table 1 shows the relationship between the thickness and the fracture ratio (ppm: parts per million) of each chip when a wafer of 6-inch diameter is divided into chips. The thickness of the wafer herein is substantially equal to or slightly less than the depth of the groove.

TABLE 1

| Chip thickness ($\mu$m) ($\approx$depth of groove) | 450 | 350 | 290 | 200 | 100 | 50 |
|---|---|---|---|---|---|---|
| Prior art (ppm) | 180 | 250 | 600 | 1000 | 5000 | 60000 |
| Present invention (ppm) | 20 | 20 | 0 | 0 | 0 | 0 |

As is shown in Table 1, the fracture ratio increases as the thickness of a chip decreases in the conventional method, whereas the fracture ratio decreases as the final thickness of a chip decreases in the present invention. This is because if the thickness of the chip is decreased, the groove can be formed shallower, so that the wafer remaining under the groove becomes thicker. When a wafer of a 6-inch diameter (600 to 650 $\mu$m in thickness) is used to form a chip of e.g. 50 $\mu$m thick in accordance with the conventional dividing method and semiconductor device manufacturing method, the wafer is previously lapped and polished to a thickness of 50 $\mu$m, and thereafter subjected to the processes illustrated in FIGS. 1 to 3. Whereas, in the method of the present invention, after the grooves of 50 μm in depth are formed (under the grooves, the wafer remains with 550 to 600 μm in thickness), the wafer is lapped and polished to divide it into chips. Thus, the fracture ratio is low in the present invention.

(2) No troubles occur depending upon the diameter of the wafer, during transfer.

The wafer is divided into chips upon lapping. Even if the chip is thin or the diameter of the wafer is the same, the wafer can be transferred within the apparatus without influence of warp of the wafer due to dicing distortion. In addition, if the chip is reduced in thickness, the wafer remaining under the grooves becomes thick. In this respect, it is possible to reduce the fracture ratio of wafers during transfer. For these reasons, the advantages shown in Table 2 can be obtained. In Table 2, an 8-inch wafer is used to obtain chips of 50 μm thick.

TABLE 2

|  | Prior art | Present invention |
| --- | --- | --- |
| Decrease in number of transfer troubles (ppm) | 80000 | 50 |
| Storage ratio to carrier (index) | 1 | 2 |

From the data of Table 2, it is clearly demonstrated that the present invention can be efficiently applied to the case where a large-diameter wafer is used. This invention can be readily adopted to a larger wafer such as a 12-inch wafer or 16-inch wafer which will be frequently used in future.

(3) In the case of the full-cut method, the wafer is cut until a cutting blade reaches the sheet placed under the wafer. As a result, the cutting edge of the blade loses its sharpness and chips are scattered during the dicing operation. Therefore, although the dicing is generally performed at a speed of 80 to 120 mm/sec in a conventional method, the speed can be increased up to 200 mm/sec in the present invention. Since the dicing speed is increased, the processing cost is successfully reduced by about 10%.

(4) It is not necessary for a cutting blade to cut the wafer until it reaches the sheet in order to divide the wafer. In addition, the wafer is divided by lapping the bottom surface with the grindstone. Thus, the size of chipping on the bottom surface decreases from about 15 μm (conventionally obtained size) to about 4 μm. Furthermore, the breaking resistance is increased from 520 Mpa (conventional case) up to 600 MPa.

When a wafer is divided into chips by lapping and polishing the bottom surface of the wafer, the degree of chipping of the bottom surface varies depending upon the diameters of diamond particles contained in the grindstone. As the diameters of the diamond particles decrease, the degree of chipping of the bottom surface decreases. Therefore, the chips are further improved in breaking resistance. Accordingly, it is preferable that the diameters of the diamond particles contained in the grindstone for use in dividing the wafer into chips should be as small as possible. As described above, if a grindstone having large-diameter grinding particles and a grindstone having small-diameter grinding particles are used in combination, it is possible to reduce the time for lapping and polishing while reducing chipping.

TABLE 3

|  | Present invention | | Prior art |
| --- | --- | --- | --- |
| Distribution of diamond particles (μm) | 4–6 | 40–60 | 4–6 |
| Average chipping from bottom surface (μm) | 3.2 | 8.76 | 13.8 |
| Maximum chipping from bottom surface (μm) | 23 | 55 | 53 |
| Average value of breaking strength of chips (MPa) | 669.0 | 560.4 | 505.5 |

(5) In order to divide the wafer, it is not necessary to cut the wafer until a cutting blade reaches the dicing sheet. It is therefore possible to reduce the wear of the dicing blade and to increase its life. For example, when the full-cut method is employed, the life of the blade is normally 10000 to 20000 lines (in the case of a 6-inch wafer). However, in the method of the present invention, the life is expected to increase up to 80000 lines or more.

(6) After the wafer is divided into chips, the chips are transferred while keeping the surfaces flat or non-flat by means of porous vacuum or electrostatic chuck. If the bottom surfaces of the chips are adsorbed, an adsorption surface having a concavity is used to hold the chips. If the surface protection tape attached to each of the upper surfaces of the chips is adsorbed, an adsorption surface having a convexity is used to hold the chips). Therefore, mutual interference between chips is prevented, with the result that quality degradation due to chipping can be avoided.

(7) Since the bottom surfaces of the chips are adhered to a surface protection tape (second holding member) having a flat ring and then the surface protection tape (first holding member) is removed, it is possible to prevent the semiconductor element from being damaged when the chip is picked up and mounted on a lead frame. In addition, the chips are held flat by the flat ring. Therefore mutual interference between the chips causing chipping is successfully prevented.

The present invention is not limited to the first to third embodiments mentioned above. The invention can be modified in various ways within the scope of the present invention. Inventions in different steps are included in the aforementioned embodiments. Various inventions can be derived if constitutional elements disclosed are suitably combined. To be more specific, if some of constitutional elements are eliminated from all elements disclosed in the embodiments, at least one of the objects set forth in "Brief Summary of the Invention" can be attained. On the other hand, at least one of advantages set forth in the specification can be obtained, the invention is established with said some of constitutional elements eliminated.

For example, the wafer 21 is fixed on the dicing chuck table 23 when the grooves are formed in the first embodiment. However, the wafer may be fixed on the dicing chuck table while a flat ring is attached to an adhesive sheet, in the same manner as in a conventional method. Alternatively, grooves may be formed while the wafer is fixed on a flat plate or the wafer is adhered on the flat plate with the adhesive sheet interposed between them.

In the step shown in FIG. 9, the surface protection tape (adhesive sheet) 26 is used as the holding member. However, other holding members may be employed which include a wax, an adsorption pad, a thermo-compression bonding sheet, a substrate coated with an adhesive material, a resist applied on a semiconductor element, and a combination thereof.

Although the surface protection tape 26 is attached to the pattern formation surface 21' of wafer 21, an extremely thin film may be interposed between the pattern formation surface 21' of wafer 21 and the surface protection tape 26. The extremely thin film is interposed as follows: a liquid called Silitecto II is first sprayed on the pattern formation surface of the wafer to form a coating film, and then, the surface protection tape is attached thereto. Alternatively, a single-sided or double-sided adhesive tape is attached to a flat plate, and then, a wafer is fixed thereon.

As explained in the foregoing, according to the present invention, it is possible to obtain the wafer dividing method and semiconductor device manufacturing method capable of preventing breakage and chipping of the wafer when the wafer is reduce in thickness and transferred, and preventing quality degradation.

It is also possible to obtain the wafer dividing method and the semiconductor device manufacturing method capable of improving the quality and yield of chips and semiconductor devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of dividing a wafer comprising:
   a first step of forming grooves in an element formation surface of a wafer, along dicing lines or chip dividing lines, said grooves being deeper than a thickness of a finished chip;
   a second step of attaching a holding member on the element formation surface of the wafer;
   a third step of lapping and polishing a bottom surface of the wafer to the thickness of the finished chip, thereby dividing the wafer into chips; and
   a fourth step of transferring the chips while holding the chips by porous adsorption.

2. The method according to claim 1, wherein an adsorption surface of the adsorbing material for use in the porous adsorption is substantially a flat plane.

3. The method according to claim 1, wherein, in said fourth step, the chips are transferred while holding bottom surfaces of the chips by adsorption and the adsorption surface of the adsorption material for use in porous adsorption is concaved.

4. The method according to claim 1, wherein, in said fourth step, the chips are transferred while holding the holding member provided on upper surfaces of the chips by adsorption and the adsorption surface of the adsorption material for use in porous adsorption is convexed.

5. The method according to claim 1, wherein said adsorption material for use in the porous adsorption is a plate having adsorption pores of 0.5 mm or less in diameter with a density of at least $1/mm^2$.

6. The method according to claim 1, wherein said adsorption material for use in the porous adsorption is formed of porous ceramic.

7. The method according to claim 1, further comprising, after said fourth step, a step of cleaning the chips.

8. A method of dividing a wafer comprising:
   a first step of forming grooves in an element formation surface of a wafer along dicing lines or chip dividing lines, said grooves being deeper than a thickness of a finished chip;
   a second step of attaching a first holding member on the element formation surface of the wafer;
   a third step of lapping and polishing a bottom surface of the wafer to the thickness of the finished chip, thereby dividing the wafer into chips;
   a fourth step of transferring the chips while holding the chips by porous adsorption;
   a fifth step of attaching bottom surfaces of the chips to a second holding member having a flat ring; and
   a sixth step of removing the first holding member.

9. The method according to claim 8, wherein an adsorption surface of the adsorption material for use in the porous adsorption is substantially flat.

10. The method according to claim 8, wherein, in said fourth step, the chips are transferred while holding the bottom surfaces of the chips and the adsorption surface of the adsorption material for use in porous adsorption is concaved.

11. The method according to claim 8, wherein, in said fourth step, the chips are transferred while holding the holding member provided on upper surfaces of the chips by adsorption and the adsorption surface of the adsorption material for use in porous adsorption is convexed.

12. The method according to claim 8, wherein said adsorption material for use in the porous adsorption is a plate having adsorption pores of 0.5 mm or less in diameter with a density of at least $1/mm^2$.

13. The method according to claim 8, wherein said adsorption material for use in the porous adsorption is formed of porous ceramic.

14. The method according to claim 8, wherein said second holding member is formed by attaching a sheet coated with a UV-curing adhesive, to a flat ring, said UV-curing adhesive being applied onto a surface of the sheet on which the chips are adhered; and the first holding member is removed after the UV-curing adhesive is cured by application of UV rays.

15. The method according to claim 8, further comprising, after the fourth step, a step of cleaning the chips.

16. A method of dividing a wafer comprising the steps of:
   forming grooves in an element formation surface of a wafer along dicing lines or chip dividing lines, said grooves being deeper than a thickness of a finished chip;
   attaching a holding member on the element formation surface of the wafer;
   lapping and polishing a bottom surface of the wafer to the thickness of the finished chip, thereby dividing the wafer into chips; and
   transferring the chips while holding the chips by an electrostatic chuck.

* * * * *